(12) United States Patent
Uehara et al.

(10) Patent No.: US 6,573,132 B1
(45) Date of Patent: Jun. 3, 2003

(54) METHOD FOR FABRICATING A SEMICONDUCTOR DEVICE HAVING CONTACTS SELF-ALIGNED WITH A GATE ELECTRODE THEREOF

(75) Inventors: Takashi Uehara, Osaka (JP); Masato Kanazawa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/515,673

(22) Filed: Feb. 29, 2000

(30) Foreign Application Priority Data

Mar. 25, 1999 (JP) ............................................ 11-081510

(51) Int. Cl.[7] .......................................... H01L 21/8238
(52) U.S. Cl. ...................... 438/211; 438/184; 438/230; 438/595; 257/410
(58) Field of Search ................................. 438/201, 209, 438/211, 212, 218, 229, 230, 184, 303, 595; 257/410, 411, 412, 413

(56) References Cited

U.S. PATENT DOCUMENTS 5,798,279 A * 8/1998 Crisenza et al. .............. 437/43
5,925,918 A * 7/1999 Wu et al. ..................... 257/413
6,075,274 A * 6/2000 Wu et al. ..................... 257/413
6,107,171 A * 8/2000 Tsai ............................. 438/584
6,127,711 A * 10/2000 Ono ............................ 257/410
6,140,219 A * 10/2000 Dennison .................... 438/618
6,277,699 B1 * 8/2001 Chen et al. .................. 438/303

FOREIGN PATENT DOCUMENTS

| JP | 61-16571 | 1/1986 |
| JP | 3-21030 | 1/1991 |

* cited by examiner

*Primary Examiner*—Olik Chaudhuri
*Assistant Examiner*—Fernando Toledo
(74) *Attorney, Agent, or Firm*—Nixon Peabody LLP; Donald R. Studebaker (57) ABSTRACT

A gate electrode is made up of a lower electrode of polysilicon and an upper electrode including a low-resistance film. A nitride sidewall is formed to cover at least the side faces of an insulator cap and the upper electrode. A pad oxide film is formed to cover at least part of the side faces of the lower electrode and part of the upper surface of a semiconductor substrate. Since a second nitride sidewall is formed to cover the first nitride sidewall and the pad oxide film, a self-aligned contact hole can be formed by etching. As a result, a semiconductor device with a highly reliable self-aligned contact can be obtained.

9 Claims, 9 Drawing Sheets

Fig. 9
PRIOR ART

METHOD FOR FABRICATING A SEMICONDUCTOR DEVICE HAVING CONTACTS SELF-ALIGNED WITH A GATE ELECTRODE THEREOF

BACKGROUND OF THE INVENTION

The present invention relates to a semiconductor device including contacts self-aligned with the gate electrode thereof, and also relates to a method for fabricating such a device.

Recently, semiconductor devices of older generations have been replaced with newer ones in at shorter and shorter cycles and the number of miniaturized devices integrated together on a single chip has been steeply rising. Reflecting these tendencies, the size of a contact hole, which is used to interconnect together the gate electrode, diffused layer and interconnection layer of an MOS transistor, has been decreasing. That is to say, the size of a contact, which is formed by filling in the contact hole with a conductive material, has been decreasing year after year. As the design rule has been minimized at such an increasing rate, it has become more and more difficult for the mask overlay accuracy to catch up with such rapid downsizing. Thus, the resultant increase in number of devices integrated is not so striking as the size reduction accomplished.

To ensure much more margin in stacking masks, a technique of forming a contact to be self-aligned with a gate electrode has been vigorously researched and developed these days. In this specification, such a contact will be simply referred to as a "self-aligned contact". In the prior art, a self-aligned contact is formed in the following manner. First, a gate electrode is covered with a silicon nitride film. Then, an interlevel dielectric film of silicon dioxide, for example, is etched using the silicon nitride film as an etch stopper so as to form a contact hole reaching a diffused layer. Thus, the gate electrode should preferably be completely covered with the silicon nitride film.

Figure 8:
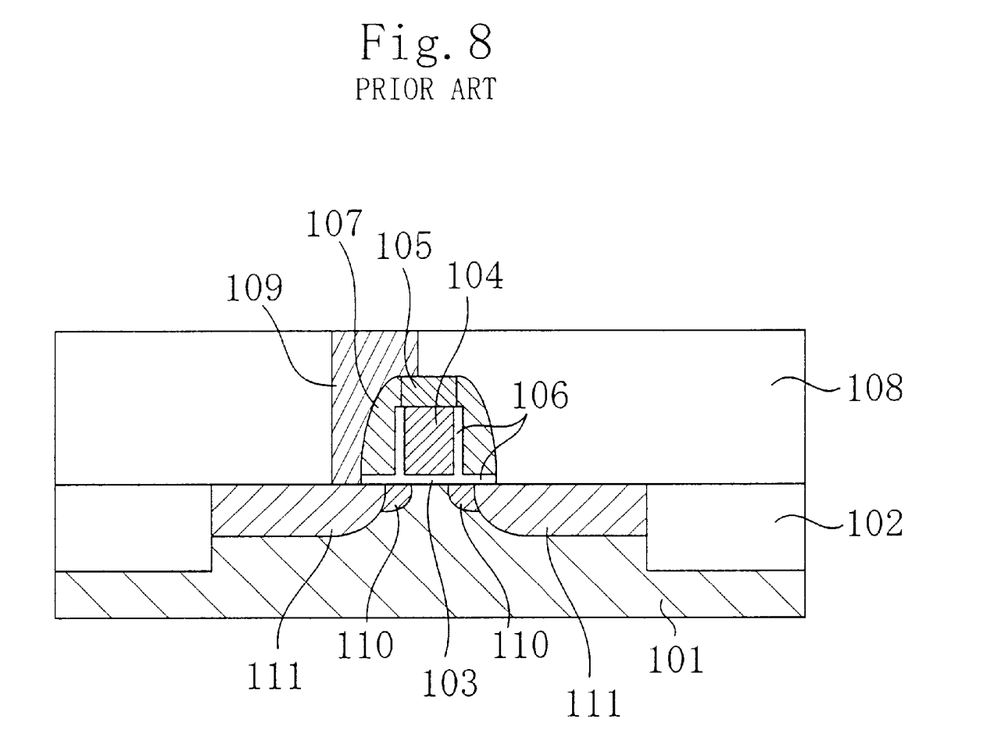
FIG. 8 is a cross-sectional view of a prior art semiconductor device formed by a fabrication process including thermal oxidation.

FIG. 8 illustrates a cross section of a prior art semiconductor device. As shown in FIG. 8, trench isolations 102 are formed on an Si substrate 101 and a transistor is formed in an active region surrounded by the trench isolations 102. The transistor includes: a gate insulating film 103 of silicon dioxide; a polysilicon gate electrode 104; an insulator cap 105 of silicon nitride; a pad oxide film 106 of silicon dioxide; and a nitride sidewall 107. As shown in FIG. 8, the gate electrode 104 is formed on the gate insulating film 103 and the insulator cap 105 is formed on the gate electrode 104. And the pad oxide film 106 covers the side faces of the gate electrode 104 and a part of the upper surface of the substrate 101. The nitride sidewall 107 covers the respective side faces of the gate electrode 104 and the insulator cap 105. The transistor further includes LDD regions 110 and heavily doped source/drain regions 111, both of which regions defined within the Si substrate 101. And a contact 109 is provided to pass through an interlevel dielectric film 108 formed on the substrate 101 and to reach one of the heavily doped source/drain regions 111. Depending on the direction of mask stacking error, the contact 109 comes into partial contact with the insulator cap 105 and the nitride sidewall 107 to serve as a self-aligned contact.

The semiconductor device may be fabricated in the following manner. First, silicon dioxide, polysilicon and silicon nitride films are deposited in this order on a semiconductor substrate 101 in which wells (not shown) are defined. Next, the silicon nitride and polysilicon films are patterned by photolithography and dry etching techniques, thereby forming the insulator cap 105 and gate electrode 104. In this process step, the silicon dioxide film is usually patterned into the same shape to form the gate insulating film 103. Then, heat treatment is conducted within oxygen ambient, thereby forming the pad oxide film 106 of silicon dioxide to cover the side faces of the gate electrode 104 and a part of the upper surface of the Si substrate 101. Thereafter, a silicon nitride film is deposited over the entire surface of the substrate and then etched back, thereby forming the sidewall 107 of silicon nitride over the respective side faces of the insulator cap 105 and the gate electrode 104. Subsequently, the interlevel dielectric film 108 is formed and the contact 109 is formed as an extension from the heavily doped source/drain regions 111.

In this structure, the polysilicon gate electrode 104 is covered with the silicon nitride insulator cap 105 and the nitride sidewall 107. Accordingly, if dry etching is performed using the silicon nitride film as an etch stopper to open the contact hole, then a self-aligned contact can be formed.

As can be seen, according to the conventional method for fabricating the semiconductor device, the pad oxide film 106 is formed as a thermal oxide film before the nitride sidewall 107 is formed. Without this pad oxide film 106, the nitride sidewall 107 would be in direct contact with the Si substrate 101. In such a situation, stress is applied through the nitride film to the gate insulating film 103, thus deteriorating the quality of the gate insulating film 103. In addition, since the transistors formed this way cannot recover from damage caused by a sintering process, the characteristics of resultant transistors are non-uniform. For these reasons, the pad oxide film 106 is required to prevent the nitride sidewall 107 from coming into direct contact with the Si substrate 101.

As semiconductor devices have been downsized and the number of those devices integrated has been increasing, it has become more and more necessary to reduce the resistance of the date electrode thereof. For that purpose, a gate electrode for an MOS transistor with the single-layer polysilicon film shown in FIG. 8 is no longer preferred. Instead, a socalled "polycide" or "poly-metal" structure prevails these days. Specifically, in a recent gate electrode structure, a single-layer metal or metal compound (such as metal silicide or nitride) film or a multilayer structure thereof is deposited on a polysilicon film.

However, many of these metals or metal compounds like metal silicides or nitrides are poorly resistant to oxidation. Accordingly, the process step of forming the pad oxide film 106 such as that shown in FIG. 8 by thermal oxidation is not applicable to a semiconductor device including the polycide or poly-metal gate electrode.

Figure 9:
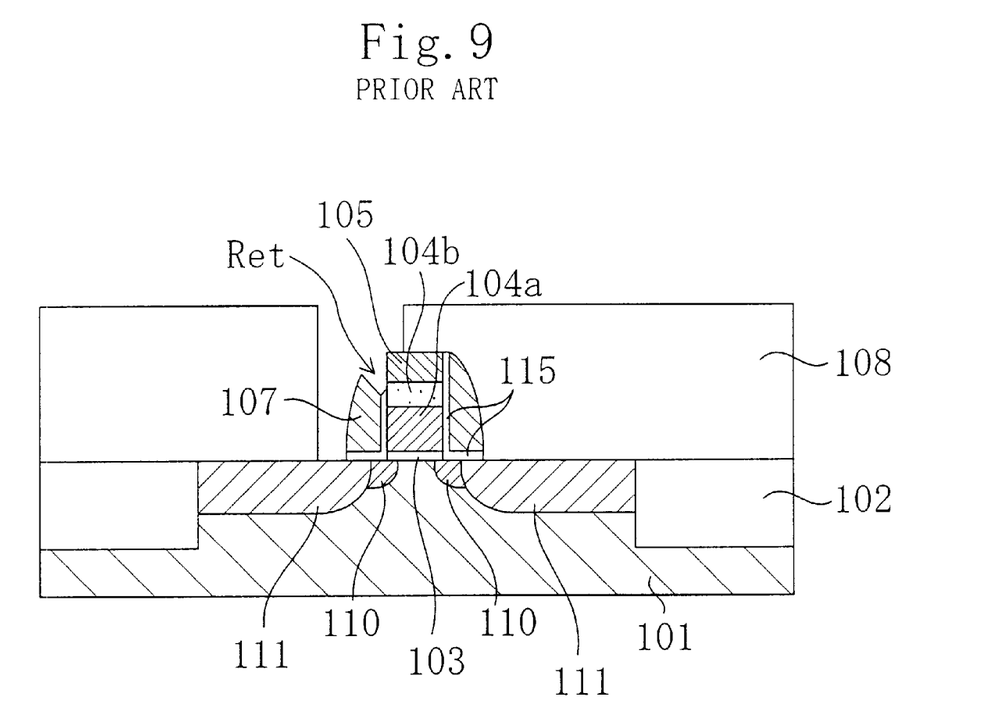
FIG. 9 is a cross-sectional view of another prior art semiconductor device including a CVD oxide film.

An alternative method has also been proposed to prevent a silicon nitride film from coming into direct contact with a semiconductor substrate. According to the technique, a silicon dioxide film is deposited by a CVD process, for example, instead of forming a pad oxide film by thermal oxidation. FIG. 9 illustrates a cross section of a semiconductor device formed by such a method. As shown in FIG. 9, an upper gate electrode 104b made of a refractory metal (or a silicide thereof) is formed on a lower gate electrode 104a of polysilicon. A CVD pad oxide film 115 with an L cross section is formed to cover the respective side faces of the insulator cap 105 land the upper and lower gate electrodes 104b and 104a and part of the surface of the Si substrate 101. And the nitride sidewall 107 is formed on the CVD pad oxide film 115. The other members of the device are the same as those illustrated in FIG. 8.

In the structure shown in FIG. 9, however, when a contact hole is formed to pass through the interlevel dielectric film 108, an upper edge of the nitride sidewall 107 might be etched away unintentionally as in a region Ret shown in FIG. 9. The reason is believed to be as follows. According to this method, when the nitride sidewall 107 and the insulator cap 105 are exposed inside the contact hole, the upper edge of the CVD pad oxide film 115 is also exposed there. Thus, if the upper edge of the CVD pad oxide film 115 is etched, then the nitride sidewall 107 is etched from both sides, thus adversely decreasing the etch selectivity between the interlevel dielectric film of silicon dioxide and the silicon nitride film.

SUMMARY OF THE INVENTION

An object of the present invention is providing a highly reliable semiconductor device and a method for fabricating the same by protecting a gate electrode using a silicon nitride film even when the gate electrode has the poly-metal or polycide structure, in which a low-resistance layer poorly resistant to oxidation is formed on a polysilicon film.

A semiconductor device according to the present invention includes a gate insulating film formed on a semiconductor substrate and a gate electrode. The gate electrode is formed on the gate insulating film and includes lower and upper electrodes that are stacked in this order. The lower electrode is made of silicon, while at least an uppermost part of the upper electrode is made of a material containing a metal. The device further includes an insulator cap formed on the gate electrode. At least an uppermost part of the insulator cap is made of silicon nitride. The device further includes: a first nitride sidewall formed to cover at least respective side faces of the upper electrode of the gate electrode and the insulator cap; and a pad oxide film formed on part of the side faces of the gate electrode and part of the upper surface of the semiconductor substrate. That part of the side faces of the gate electrode is not covered with the first nitride sidewall. The device further includes: a second nitride sidewall formed on the first nitride sidewall and the pad oxide film; doped regions, which are defined within the semiconductor substrate and located beside the gate electrode; an interlevel dielectric film formed on the semiconductor substrate; and a contact, which passes through the interlevel dielectric film to reach one of the doped regions and is self-aligned with the gate electrode.

In this structure, the upper and side faces of the upper electrode of the gate electrode, which includes a part made of a material containing a metal poorly resistant to oxidation, are covered with the nitride films. Thus, when an oxidation process step is performed to form the pad oxide film, the upper electrode receives no damage. Also, even if the second nitride sidewall and the insulator cap are exposed within a contact hole when a contact is formed by filling in the contact hole, the etch selectivity of the second nitride sidewall does not decrease. This is because the first nitride sidewall is located under the upper edge portion of the second nitride sidewall. In addition, the pad oxide film is interposed between these nitride sidewalls and at least the lower edge portion of the lower electrode. Accordingly, no stress is applied from the nitride films to the lower electrode and to the semiconductor substrate. Thus, a semiconductor device including not only a low-resistance gate electrode but also a self-aligned contact can be obtained without risking the reliability thereof.

In one embodiment of the present invention, the upper and lower electrodes may be stacked one upon the other such that the upper electrode is in direct contact with the upper surface of the lower electrode. In such an embodiment, a resultant MISFET with a poly-metal or polycide gate structure can attain the above effects.

In this particular embodiment, the first nitride sidewall preferably covers part of the side faces of the lower electrode. The pad oxide film is preferably formed on the other part of the side faces of the lower electrode, except for that part covered with the first nitride sidewall, and on a part of the upper surface of the semiconductor substrate.

In another embodiment of the present invention, the semiconductor device may further include an interelectrode insulating film interposed between the upper and lower electrodes. The upper electrode may be a control gate electrode, while the lower electrode may be a floating gate electrode.

In such an embodiment, a semiconductor device, which includes not only a low-resistance gate electrode but also a self-aligned contact and functions as a memory cell transistor for a nonvolatile memory, can be obtained without risking the reliability thereof.

In this particular embodiment, the upper electrode may be formed out of a single layer metal film. Alternatively, the upper electrode may have a multilayer structure, in which a silicon film and a conductor film containing a metal are stacked in this order.

In another alternative embodiment, the first nitride sidewall may be formed on the side faces of the upper electrode and on at least part of the side faces of the interelectrode insulating film. The pad oxide film may be formed at least over the entire side faces of the lower electrode. In such an embodiment, the first nitride sidewall is formed on the side faces of the upper electrode over the interelectrode insulating film, while the pad oxide film is formed on the side faces of the lower electrode under the interelectrode insulating film.

As still another alternative, the first nitride sidewall may be formed on the side faces of the upper electrode and the interelectrode insulating film and on part of the side faces of the lower electrode. The pad oxide film may be formed on the other part of the side faces of the lower electrode, except for that part covered with the first nitride sidewall, and on the part of the upper surface of the semiconductor substrate. In such an embodiment, a bird's-beak-free interelectrode insulating film can be obtained and high capacitance coupling is attainable between the control and floating gate electrodes.

An inventive method for fabricating a semiconductor device includes the step of a) forming a gate insulating film, a lower electrode film made of silicon, an upper electrode film and a cap insulating film in this order on a semiconductor substrate. At least an uppermost part of the upper electrode film is made of a material containing a metal. At least an uppermost part of the cap insulating film is made of silicon nitride. The method further includes the steps of: b) etching at least the cap insulating film and the upper electrode film to form an insulator cap and an upper electrode of a gate electrode and stopping etching no later than completion of etching the lower electrode film; c) forming a first nitride sidewall on respective side faces of the insulator cap and the upper electrode of the gate electrode that have been patterned in the step b) and on an etched part of the side faces of the lower electrode film; d) etching non-etched parts of the lower electrode film using the first nitride sidewall and the insulator cap as a mask, thereby forming a lower electrode for the gate electrode; e) forming a pad oxide film by thermal oxidation on part of the side faces of the lower electrode of the gate electrode that is located under the first nitride sidewall and on a part of the upper surface of the semiconductor substrate; f) forming a second nitride sidewall on the first nitride sidewall and on the pad oxide film; g) defining doped regions within the semiconductor substrate such that the doped regions are located beside the gate electrode; h) forming an interlevel dielectric film over the semiconductor substrate; and i) forming a contact hole that passes through the interlevel dielectric film to reach one of the doped regions and is self-aligned with the gate electrode.

According to this method, when the pad oxide film is formed in the step e), the side faces of the upper electrode, of which at least the uppermost part is made of a material containing a metal, have already been covered with the first nitride sidewall in the step d). Thus, that metal part of the upper electrode does not deteriorate due to oxidation. Also, even if the contact hole overlaps with the gate electrode when a contact is formed in the step i), the first and second nitride sidewalls and the insulator cap can prevent the contact hole from reaching the gate electrode. In addition, when the device is completed, the lower edge portion of the lower electrode is covered with the pad oxide film on its side faces. Thus, no stress is applied from the second nitride sidewall to the semiconductor substrate or the gate electrode. As a result, a semiconductor device with a highly reliable self-aligned contact structure can be formed.

In one embodiment of the present invention, the upper and lower electrode films may be stacked one upon the other in the step a) such that the upper electrode film is in direct contact with the upper surface of the lower electrode film. In such an embodiment, a transistor with a highly reliable self-aligned contact structure, which can function as a MISFET, can be formed.

In this particular embodiment, the etching step b) is preferably stopped after part of the lower electrode film has been etched and the other part thereof has not been etched yet. In the step c), the first nitride sidewall is preferably formed on the etched part of the side faces of the lower electrode film. And in the step e), the pad oxide film is preferably formed on the other part of the side faces of the lower electrode and on the part of the upper surface of the semiconductor substrate. In such an embodiment, the side faces of the upper electrode film can be entirely covered with the first nitride sidewall.

Alternatively, in the step a), the lower electrode film of silicon may be made up of upper and lower silicon film portions that can be etched selectively with respect to each other. In the step c), the lower silicon film portion may be used as an etch stopper. In such an embodiment, the etching step b) can be stopped at an easily controllable timing.

In another embodiment of the present invention, an interelectrode insulating film may be formed in the step a) between the upper and lower electrode films. In the step b), a control gate electrode may be formed as the upper electrode. And in the step d), a floating gate electrode may be formed as the lower electrode. In such an embodiment, a semiconductor device with a highly reliable self-aligned contact structure, which functions as a memory cell transistor for a nonvolatile memory, can be obtained.

In this particular embodiment, a single layer metal film may be formed in the step a) as the upper electrode film. Alternatively, a silicon film and a conductor film containing a metal may be stacked in the step a) in this order to form the upper electrode film.

As another alternative, the interelectrode insulating film may be used in the step b) as an etch stopper and etching may be stopped when the lower electrode film is not etched at all. In the step c), the first nitride sidewall may be formed on the side faces of the upper electrode and on at least part of the side faces of the interelectrode insulating film. And in the step e), the pad oxide film may be formed at least over the entire side faces of the lower electrode. In such an embodiment, the etching step b) can be stopped at an easily controllable timing.

As still another alternative, the etching step b) may be stopped after part of the lower electrode film has been etched but the other part thereof has not been etched yet. In the step c), the first nitride sidewall may be formed on the side faces of the upper electrode and the interelectrode insulating film and on part of the side faces of the lower electrode film. And in the step e), the pad oxide film may be formed on the other part of the side faces of the lower electrode, except for the part covered with the first nitride sidewall, and on the part of the upper surface of the semiconductor substrate. In such an embodiment, when the pad oxide film is formed, the side faces of the interelectrode insulating film have already been covered with the first nitride sidewall, thus preventing any bird's beak from being formed at the edges of the interelectrode insulating film. As a result, high capacitance coupling is attainable between the control and floating gate electrodes in the semiconductor device.

BRIEF DESCRIPTION OF THE DRAWINGS

FIGS. 2(a) through 3(d) are cross-sectional views illustrating respective process steps for fabricating the semiconductor device according to the first embodiment.

DESCRIPTION OF THE PREFERRED EMBODIMENTS

Hereinafter, preferred embodiments of the present invention will be described with reference to the accompanying drawings.

EMBODIMENT 1

Figure 1:
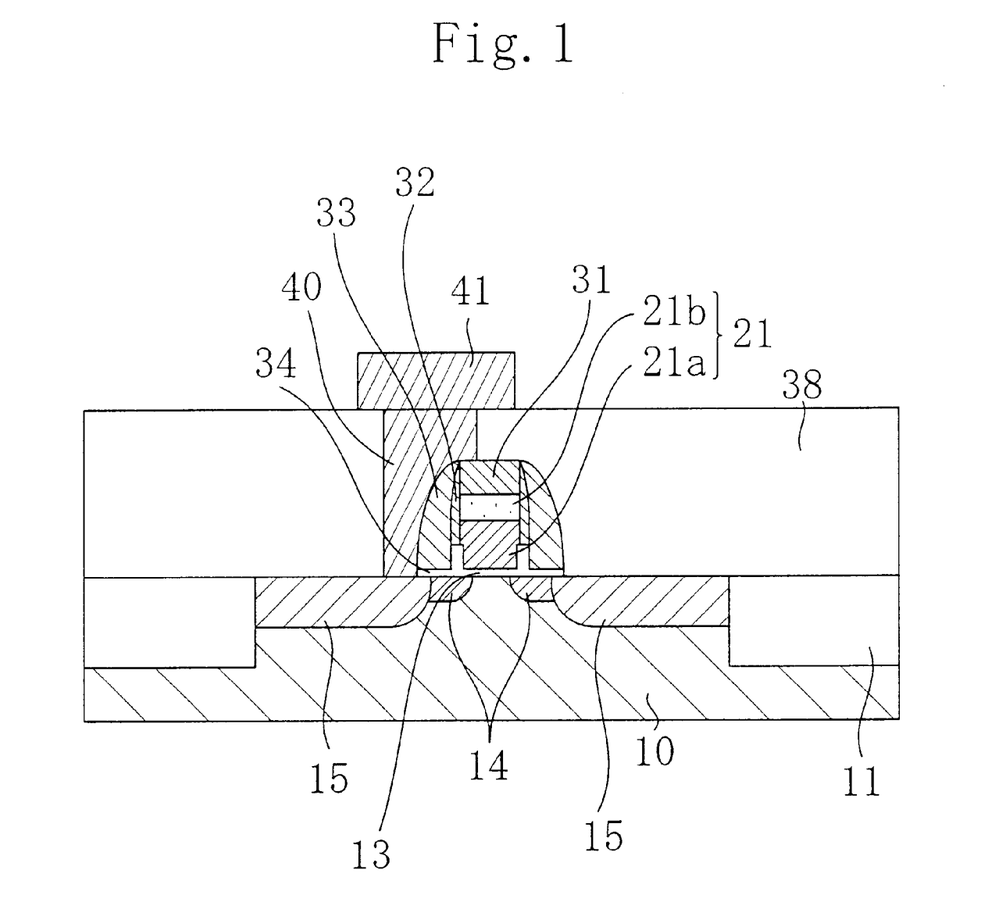
FIG. 1 is a cross-sectional view of a semiconductor device according to a first embodiment of the present invention.

FIG. 1 illustrates a cross-sectional structure of a semiconductor device according to a first embodiment of the present invention. As shown in FIG. 1, trench isolations 11 are formed on an Si substrate 10 and a transistor is formed in an active region surrounded by the trench isolations 11. The transistor includes: a gate insulating film 13 of silicon dioxide; a gate electrode 21; an insulator cap 31 of silicon nitride; a pad oxide film 34 of silicon dioxide; and first and second nitride sidewalls 32 and 33. As shown in FIG. 1, the gate electrode 21 consists of a polysilicon film 21a and a low-resistance film 21b that are formed in this order on the gate insulating film 13. The insulator cap 31 is formed on the gate electrode 21. The pad oxide film 34 is formed to cover part of the side faces of the gate electrode 21 and part of the upper surface of the substrate 10. The first nitride sidewall 32 is formed to cover the other part of the side faces of the gate electrode 21 and the side faces of the insulator cap 31. And the second nitride sidewall 33 is formed to cover the first nitride sidewall 32 and the pad oxide film 34. The transistor further includes LDD regions 14 and heavily doped source/drain regions 15, both of which regions are defined within the Si substrate 10. A contact 40 is provided to pass through an interlevel dielectric film 38 formed on the substrate 10 and to reach one of the heavily doped source/drain regions 15. And a metal interconnection line 41 is connected to the contact 40 and extends over the inter-level dielectric film 38. Depending on the direction of a mask stacking error, the contact 40 comes into partial contact with the insulator cap 31 and the nitride sidewalls 32 and 33 to serve as a self-aligned contact.

The structure of the semiconductor device according to this embodiment is characterized in the following respects. Specifically, the gate electrode 21 consists of a lower electrode 21a of polysilicon and an upper electrode 21b, which is implemented as a stack of titanium nitride and tungsten films to have its resistance reduced. The pad oxide film 34 is in contact with only the lower half of the lower electrode 21a. And over the pad oxide film 34, the first nitride sidewall 32 is in contact with the upper half of the lower electrode 21a, the upper electrode 21b and the insulator cap 31. In other words, the underlying layer of the second nitride sidewall 33 includes the first nitride sidewall 32 in the upper half and the pad oxide film 34 in the lower half. In such a structure, even if the second nitride sidewall 33 and the insulator cap 31 are exposed within a contact hole being etched to form the contact 40, the etch selectivity of the second nitride sidewall 33 does not decrease. This is because the first nitride sidewall 32 is located under the upper edge portion of the second nitride sidewall 33. Thus, no part of the pad oxide film is etched while the contact hole is being formed unlike the case shown in FIG. 9. In addition, the upper and side faces of the upper electrode 21b, which is formed out of a low-resistance film poorly resistant to oxidation, are covered with the nitride films. Thus, when an oxidation process step is performed to form the pad oxide film 34, the low-resistance film receives no damage as will be described later. In addition, at least the lower side edges of the gate electrode 21 are covered with the pad oxide film 34. Accordingly, no stress is applied from the first or second nitride sidewall 32 or 33 to the gate electrode 21, gate insulating film 13 or silicon substrate 10. Thus, the quality of the gate insulating film 13 does not deteriorate and the characteristics of the transistors can be uniformized.

As a result, a self-aligned contact can be formed with the resistance of the gate electrode 21 reduced and without degrading the reliability of the device.

Next, it will be described with reference to FIGS. 2(a) through 2(e) and 3(a) through 3(d) how to fabricate the semiconductor device according to the first embodiment.

Figure 2A:
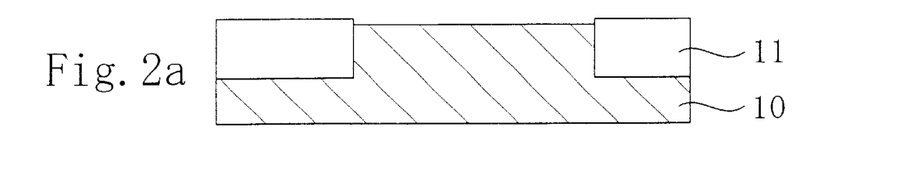

First, in the process step shown in FIG. 2(a), the trench isolations 11 are formed on the Si substrate 10 to surround the active region.

Figure 2B:
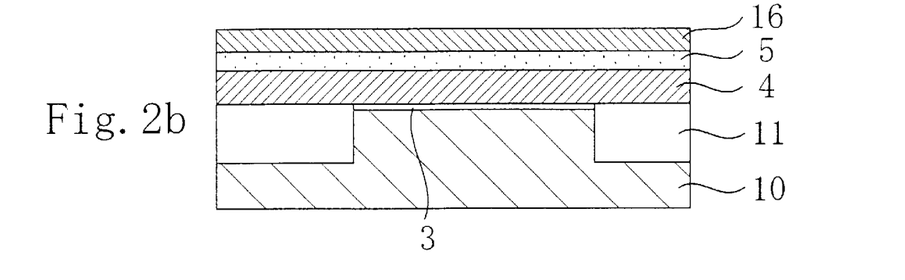

Next, in the process step shown in FIG. 2(b), the surface of the Si substrate 10 is thermally oxidized to form a silicon dioxide film 3 thereon to a thickness of about 10 nm. Then, a polysilicon film 4 with a thickness of 100 nm, a low-resistance film 5 consisting of titanium nitride and tungsten films with thicknesses of about 10 nm and about 90 nm, respectively, and a silicon nitride film 16 with a thickness of about 150 nm are deposited by a CVD process in this order on the silicon dioxide film 3.

Figure 2C:
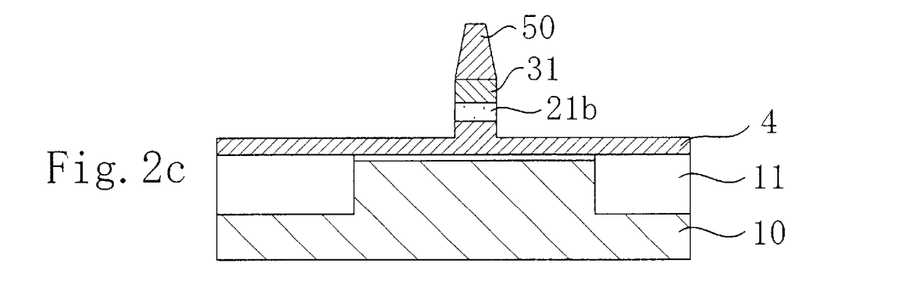

Subsequently, in the process step shown in FIG. 2(c), a resist pattern 50 is defined to form the gate electrode and the silicon nitride 16, low-resistance 5 and polysilicon films 4 are dry-etched and patterned in this order, thereby forming the insulator cap 31 and the upper electrode 21b. In this process step, the polysilicon film 4 is removed to about half the thickness thereof (i.e., about 50 nm). To etch the polysilicon film 4 smoothly in this manner, the polysilicon film 4 should preferably consist of lower and upper portions that have been deposited separately. For example, the lower portion of the polysilicon film 4 may be deposited to a thickness of about 50 nm and be heavily doped with an n-type (or p-type) dopant at that point in time. Then, a non-doped upper portion of the polysilicon film may be deposited thereon. In this manner, the etch selectivity of the upper to the lower portion of the polysilicon film 4 can be increased. Also, if the etching process step is performed under such conditions as allowing only the upper portion of the polysilicon film 4 to be removed efficiently, then patterning may be stopped in the state shown in FIG. 2(c).

Figure 2D:
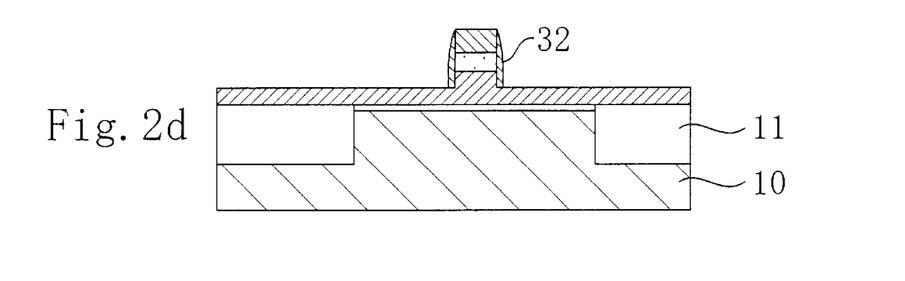

Thereafter, in the process step shown in FIG. 2(d), the resist pattern 50 is stripped and a silicon nitride film for first sidewall is deposited to a thickness of about 10 nm over the entire surface of the substrate. Then, the silicon nitride film is etched back, thereby forming the first nitride sidewall 32 only on the side faces that have been patterned in the process step shown in FIG. 2(c). At this point in time, the side faces of the insulator cap 31 and the upper electrode 21b are completely covered with the silicon nitride film.

Figure 2E:
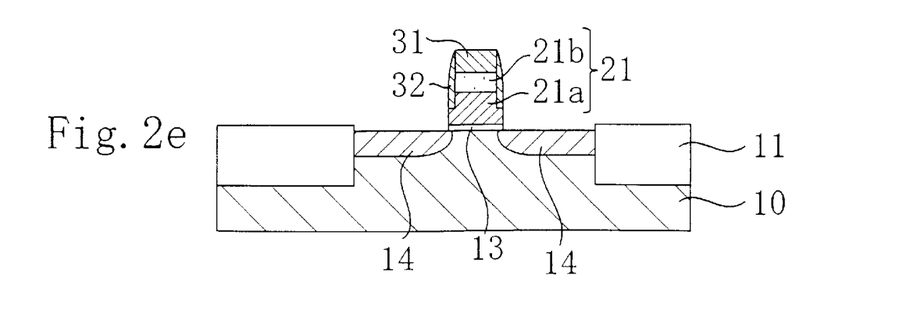
Figure 3A:
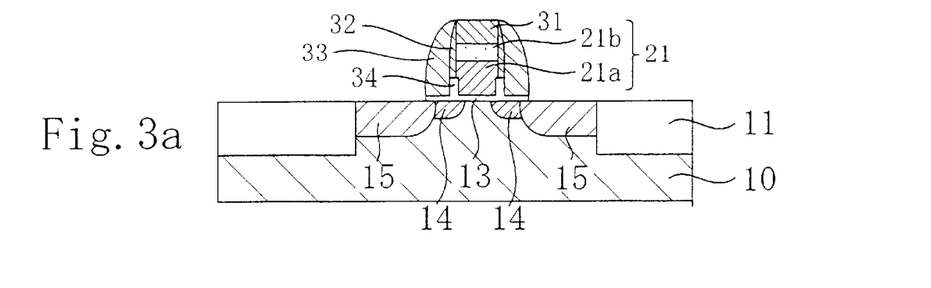

Next, in the process step shown in FIG. 2(e), remaining parts of the polysilicon film 4 and the silicon dioxide film 3 are patterned using the insulator cap 31 and the first nitride sidewall 32 as a mask, thereby forming the lower electrode 21a and the gate insulating film 13. Then, dopant ions are implanted lightly into the Si substrate 10 using the insulator cap 31 and the first nitride sidewall 32 as a mask, thereby forming lightly-doped source/drain (LDD) regions 14 to be self-aligned with the gate electrode 21. This ion implantation may be performed to form the LDD regions 14 after the pad oxide film 34 has been formed as shown in FIG. 3(a).

Subsequently, in the process step shown in FIG. 3(a), exposed parts of the lower electrode 21a of the gate electrode 21 and the upper surface of the Si substrate 10 are oxidized to form the pad oxide film 34 to a thickness of about 10 nm under the first nitride sidewall 32. Thereafter, a silicon nitride film for second sidewall is deposited to a thickness of about 80 nm over the entire surface of the substrate and then etched back, thereby forming the second nitride sidewall 33 over the first nitride sidewall 32 and the pad oxide film 34. Then, dopant ions are implanted heavily into the Si substrate 10 using the insulator cap 31 and the second nitride sidewall 33 as a mask, thereby defining the heavily doped source/drain regions 15.

Figure 3B:
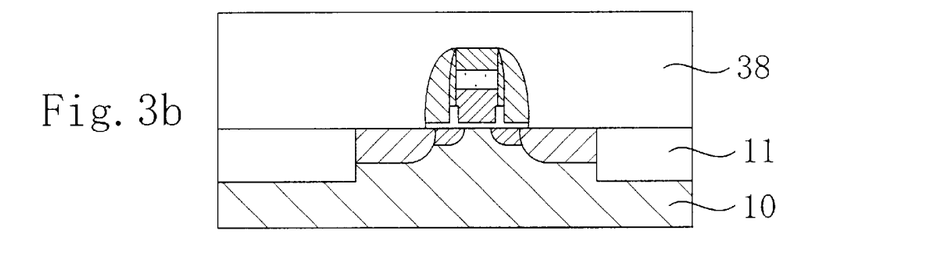

Thereafter, in the process step shown in FIG. 3(b), a CVD silicon dioxide film is deposited to a thickness of about 1 $\mu$m over the entire surface of the substrate and then planarized by a CMP technique so as to form the interlevel dielectric film 38 to a thickness of about 600 nm.

Subsequently, in the process step shown in FIG. 3(c), a resist pattern 51 for opening contact holes is defined on the interlevel dielectric film 38. And the interlevel dielectric film 38 is dry-etched using the resist pattern 51 as a mask, thereby forming a contact hole 39 passing through the interlevel dielectric film 38 to reach one of the heavily doped source/drain regions 15. Although not shown in the cross section illustrated in FIG. 3(c), another contact hole 39 is also opened to reach the other of the heavily doped source/drain regions 15. In this case, if the distance between adjacent contact holes 39 has no margin, then the respective surfaces of the second nitride sidewall 33 and the insulator cap 31 are exposed inside at least one of these contact holes 39.

Figure 3C:
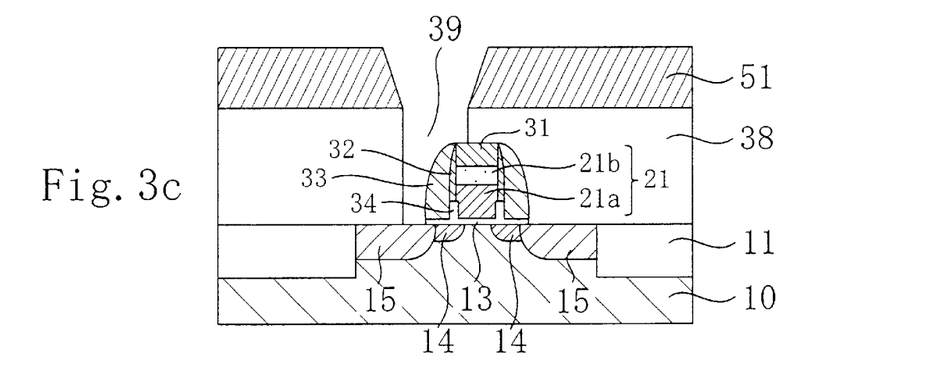
Figure 3D:
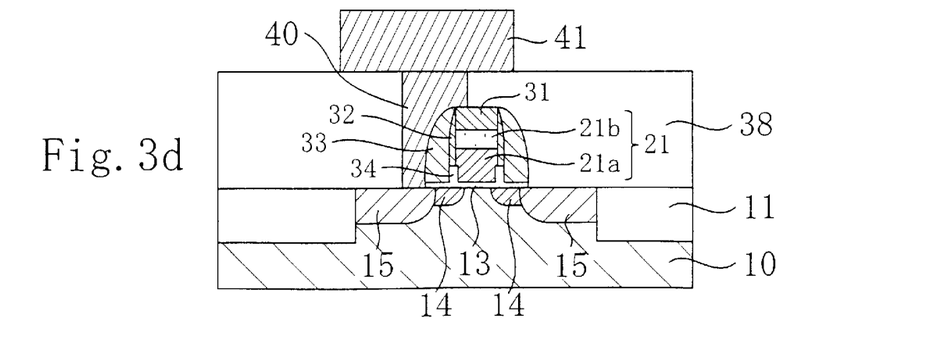

Finally, in the process step shown in FIG. 3(d), the contact holes 39 are filled in with tungsten, for example, to form the contacts 40 and then the metal interconnection lines 41 of an aluminum alloy, for example, are formed on the interlevel dielectric film 38.

In the fabrication process according to this embodiment, when the gate electrode 21 is patterned in FIG. 2(e), the upper and side faces of the upper electrode 21b made of a low-resistance film are covered with the nitride films (i.e., the insulator cap 31 and first nitride sidewall 32) and are not exposed. Accordingly, even if an oxidation process is performed to form the pad oxide film 34 in the process steps shown in FIGS. 2(e) and 3(a), the low-resistance film is not oxidized abnormally. Thus, the low-resistance film for the upper electrode 21b may be made of a material poorly resistant to oxidation, e.g., titanium nitride, titanium or titanium silicide.

In addition, in the step of forming the contact hole shown in FIG. 3(c), even if the insulator cap 31 and the second nitride sidewall 33 are exposed within the contact hole 39, the upper edge portion of the second nitride sidewall 33 is not etched unintentionally due to the decrease in etch selectivity unlike the prior art semiconductor device shown in FIG. 9. This is because it is not the silicon dioxide film but the nitride film (i.e., the first nitride sidewall 32) that is interposed between the second nitride sidewall 33 and the insulator cap 31. That is to say, a self-aligned contact can be formed easily. Moreover, the lower side edges of the gate electrode 21 are finally covered with the pad oxide film 34. Accordingly, no stress is applied from the first or second nitride sidewall 32 or 33 to the gate electrode 21, gate insulating film 13 or silicon substrate 10. Thus, the quality of the gate insulating film 13 does not deteriorate and the characteristics of the transistors can be uniformized.

It should be noted that at least the uppermost part of the insulator cap 31 is preferably made of silicon nitride. Accordingly, the insulator cap 31 may be a stack of two or three layers including silicon dioxide and silicon nitride films.

The polysilicon film 4 for the lower electrode 21a does not have to be the stack of heavily-doped and non-doped polysilicon films exemplified above. For example, the polysilicon film may be replaced with a single-layer amorphous silicon film. Also, a pair of silicon films that have been deposited under different conditions, e.g., a polysilicon film and an amorphous silicon film, may be used. Furthermore, a film serving as a stopper in the process step shown in FIG. 2(c) may be inserted between the upper and lower polysilicon films.

In the foregoing embodiment, the trench isolations 11 are formed before the silicon dioxide film 3 is deposited as a prototype of the gate insulating film. Alternatively, a field oxide film may be formed by a LOCOS process.

Also, the method of this embodiment is equally applicable to a process of forming trench isolations after a silicon dioxide film has been formed as a prototype of a gate insulating film (see Japanese Laid-Open Publication No. 7-324749, for example).

EMBODIMENT 2

Figure 4:
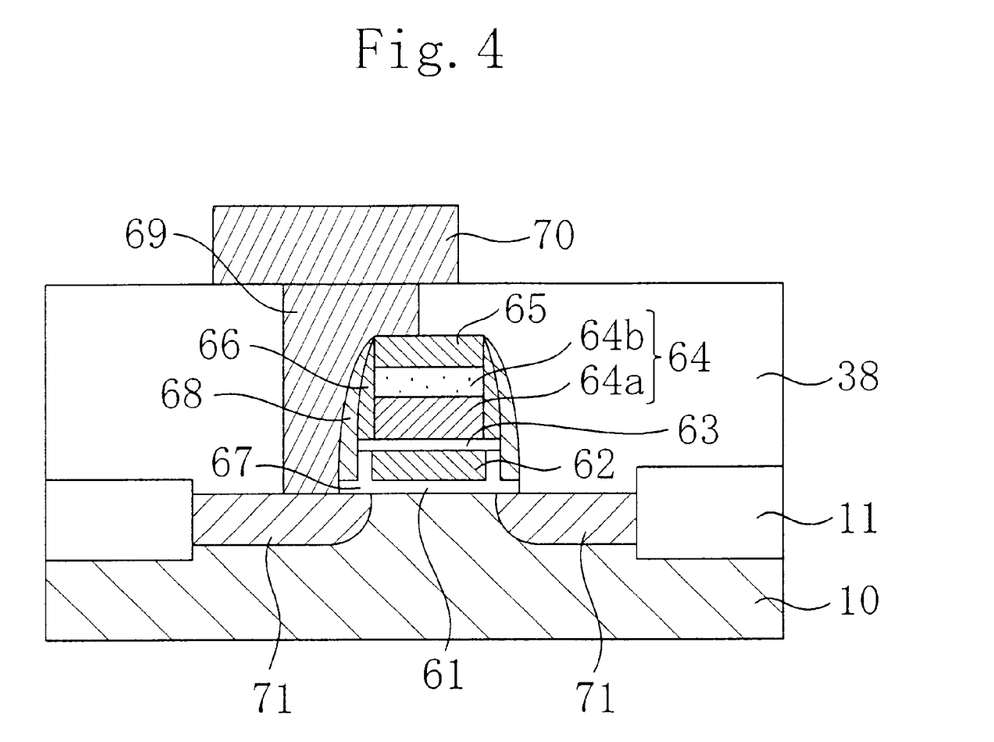
FIG. 4 is a cross-sectional view of a semiconductor device according to a second embodiment of the present invention.

FIG. 4 illustrates a cross section of a memory cell transistor for a nonvolatile memory, which is an exemplary semiconductor device according to a second embodiment of the present invention. As shown in FIG. 4, trench isolations 11 are formed on an Si substrate 10 and a memory cell transistor for a nonvolatile memory is formed in an active region surrounded by the trench isolations 11. The transistor includes: a tunnel insulating film 61 of silicon dioxide; a floating gate electrode 62 of polysilicon; an interelectrode insulating film 63 of silicon dioxide; a control gate electrode 64; and an insulator cap 65 of silicon nitride. These films 61, 62, 63, 64 and 65 are stacked in this order on the Si substrate 10. The transistor further includes a pad oxide film 67 of silicon dioxide and first and second nitride sidewalls 66 and 68 of silicon nitride. As shown in FIG. 4, the floating gate electrode 62 and the control gate electrode 64 correspond to the lower and upper electrodes, respectively. The control gate electrode 64 consists of a polysilicon portion 64a and a low-resistance portion 64b. The pad oxide film 67 is formed to cover the side faces of the floating gate electrode 62 and part of the surface of the substrate 10. The first nitride sidewall 66 is formed to cover the respective side faces of the control gate electrode 64 and the insulator cap 65. And the second nitride sidewall 68 is formed to cover the first nitride sidewall 66 and the pad oxide film 67. The transistor further includes source/drain regions 71 defined within the Si substrate 10. A contact 69 is provided to pass through an interlevel dielectric film 38 formed over the substrate 10 and to reach one of the source/drain regions 71. And a metal interconnection line 70 is connected to the contact 69 and extends over the interlevel dielectric film 38. Depending on the direction of a mask stacking error, the contact 69 comes into partial contact with the insulator cap 65 and the nitride sidewalls 66 and 68 to serve as a self-aligned contact.

The structure of the semiconductor device according to this embodiment is characterized in the following respects. Specifically, the control gate electrode 64 consists of: the is polysilicon portion 64a; and the low-resistance portion 64b, which is a stack of titanium nitride and tungsten films. The pad oxide film 67 is in contact with only the floating gate electrode 62 under the interelectrode insulating film 63. And over the interelectrode insulating film 63, the first nitride sidewall 66 is in contact with the polysilicon 64a and low-resistance portions 64b of the control gate electrode 64 and the insulator cap 65. In other words, the underlying layer of the second nitride sidewall 68 includes the first nitride sidewall 66 in the upper half and the pad oxide film 67 in the lower half. In such a structure, even if the second nitride sidewall 68 and the insulator cap 65 are exposed within a contact hole being etched to form the contact 69, the etch selectivity of the second nitride sidewall 68 does not decrease. This is because the first nitride sidewall 66 is located under the upper edge portion of the second nitride sidewall 68. Thus, no part of the pad oxide film is etched while the contact hole is being formed unlike the case shown in FIG. 9. In addition, the upper and side faces of the low-resistance portion 64b of the control gate electrode 64, which is poorly resistant to oxidation, are covered with the nitride films. Thus, when an oxidation process step is performed to form the pad oxide film 67, the low-resistance portion 64b receives no damage as will be described later. Thus, the reliability of the device can be improved with the resistance of the control gate electrode 64 reduced.

Hereinafter, it will be described with reference to FIGS. 5(a) through 5(d) how to fabricate the semiconductor device according to the second embodiment.

Figure 5A:
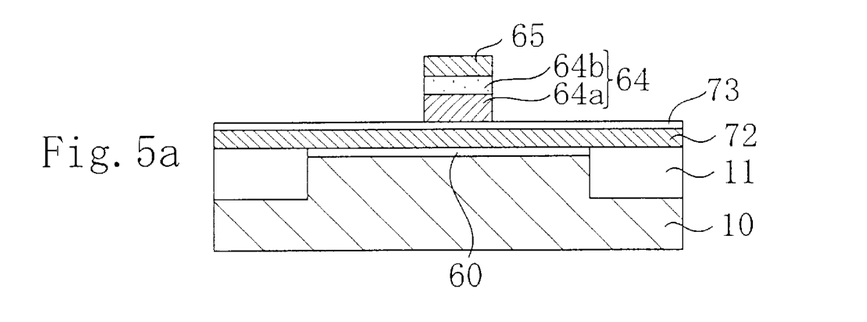
FIGS. 5(a) through 5(d) are cross-sectional views illustrating respective process steps for fabricating the semiconductor device according to the second embodiment.

First, before the structure shown in FIG. 5(a) is formed, the trench isolations 11 are formed on the Si substrate 10 to surround the active region as in the first embodiment. Next, the surface of the Si substrate 10 is thermally oxidized to form a silicon dioxide film 60 thereon to a thickness of about 10 nm. Then, a first polysilicon film 72 with a thickness of about 100 nm, a silicon dioxide film 73 with a thickness of about 20 nm, a second polysilicon film with a thickness of about 100 nm, a low-resistance film consisting of titanium nitride and tungsten films with thicknesses of about 10 nm and about 90 nm, respectively, and a silicon nitride film with a thickness of about 150 nm are deposited by a CVD process in this order on the silicon dioxide film 60. Subsequently, a resist pattern is defined to form the gate electrode, and the silicon nitride, low-resistance and second polysilicon films are dry-etched and patterned in this order. In this manner, the insulator cap 65 and the low-resistance 64b and polysilicon portions 64a of the control gate electrode 64 are formed as shown in FIG. 5(a). In this process step, the etch selectivity of the second polysilicon film to the silicon dioxide film can be easily set large and the silicon dioxide film 73 can be used as an etch stopper. Thereafter, the resist pattern is stripped.

Figure 5B:
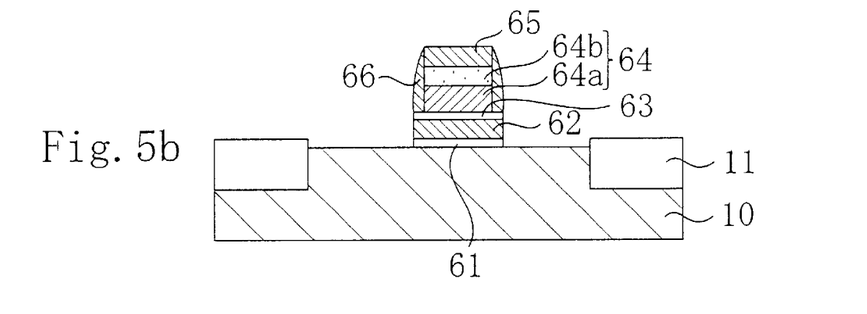

Then, in the process step shown in FIG. 5(b), a silicon nitride film for first sidewall is deposited to a thickness of about 10 nm over the entire surface of the substrate and etched back. In this manner, the first nitride sidewall 66 is formed only on the side faces patterned in the process step shown in FIG. 5(a). At this point in time, the side faces of the insulator cap 65 and the polysilicon 64a and low-resistance portions 64b of the control gate electrode 64 are completely covered with the first nitride sidewall 66 of silicon nitride. Then, the silicon dioxide film 73, first polysilicon film 72 and silicon dioxide film 60 are patterned using the insulator cap 65 and the first nitride sidewall 66 as a mask, thereby forming the interelectrode insulating film 63, floating gate electrode 62 and tunnel insulating film 61, respectively.

Figure 5C:
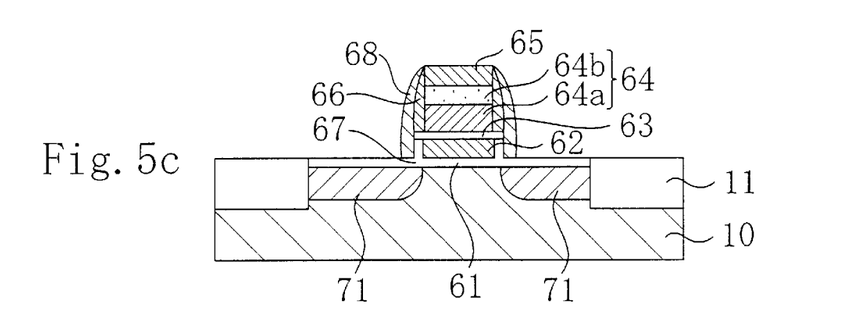

Next, in the process step shown in FIG. 5(c), exposed parts of the floating gate electrode 62 and the upper surface of the Si substrate 10 are oxidized to form the pad oxide film 67 to a thickness of about 10 nm under the interelectrode insulating film 63. In this case, the floating gate electrode 62 and the silicon substrate 10 are oxidized near the exposed edges of the tunnel insulating film 61. As a result, bird's beaks are formed at both edges of the tunnel insulating film 61. If both edges of the interelectrode insulating film 63 are partially exposed, then bird's beaks are also formed near these edges because the floating gate 62 and control gate electrodes 64 are oxidized near the edges.

Thereafter, a silicon nitride film for second sidewall is deposited to a thickness of about 80 nm over the entire surface of the substrate and then etched back, thereby forming the second nitride sidewall 68 over the first nitride sidewall 66 and the pad oxide film 67. Then, dopant ions are implanted into the Si substrate 10 using the insulator cap 65 and the second nitride sidewall 68 as a mask, thereby defining the source/drain regions 71 to be self-aligned with the floating gate electrode 62.

Subsequently, in the process step shown in FIG. 5(d), a CVD silicon dioxide film is deposited to a thickness of about 1 μm over the entire surface of the substrate and then planarized by a CMP technique so as to form the interlevel dielectric film 38 to a thickness of about 600 nm. Next, a resist pattern 74 for opening contacts is defined on the interlevel dielectric film 38. And the interlevel dielectric film 38 is dry-etched using the resist pattern 74 as a mask, thereby forming a contact hole 75 passing through the interlevel dielectric film 38 and reaching one of the source/drain regions 71. Although not shown in the cross section illustrated in FIG. 5(d), another contact hole 75 is also opened to reach the other of the source/drain regions 71. In this case, if the distance between adjacent contact holes 75 has no margin, then the respective surfaces of the second nitride sidewall 68 and the insulator cap 65 are exposed inside at least one of these contact holes 75.

Although subsequent process steps are not illustrated, the contact holes 75 are filled in with tungsten, for example, to form the contacts 69 and then the metal interconnection lines 70 of an aluminum alloy, for example, are formed on the interlevel dielectric film 38 as in the first embodiment.

According to this embodiment, when the floating gate electrode 62 is patterned as shown in FIG. 5(b), the upper and side faces of the low-resistance portion 64b including a tungsten film poorly resistant to oxidation are covered with the nitride films (i.e., the insulator cap 65 and the first nitride sidewall 66) and are not exposed. Thus, even if an oxidation process is performed to form the pad oxide film 67 in the process step shown in FIG. 5(c), the low-resistance portion 64b is not oxidized abnormally. Accordingly, the low-resistance portion 64b may be formed out of a film containing material poorly resistant to oxidation, e.g., tungsten, titanium nitride, titanium or titanium silicide.

In addition, bird's beaks are formed at both edges of the tunnel insulating film 61. Thus, even if a voltage as high as about 15 V is applied between the floating gate electrode 62 and the source/drain regions 71, the reliability of the tunnel insulating film 61 can be kept high. This is because those portions of the tunnel insulating film 61 located between the floating gate electrode 62 and the source/drain regions 71 are relatively thick.

Figure 5D:
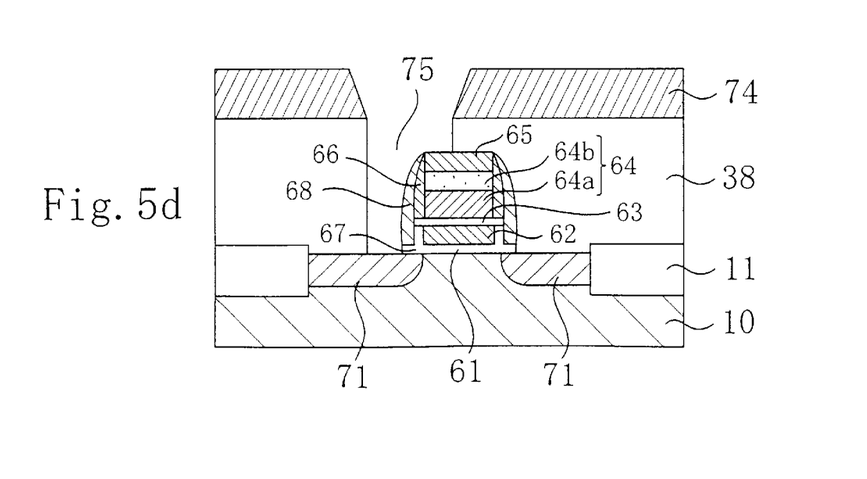

Moreover, in the process step of forming the contact hole shown in FIG. 5(d), even if the insulator cap 65 and the second nitride sidewall 68 are exposed within the contact hole 75, the upper edge portion of the second nitride sidewall 68 is not etched unintentionally due to the decrease in etch selectivity unlike the prior art semiconductor device shown in FIG. 9. This is because it is not the silicon dioxide film but the nitride film (i.e., the first nitride sidewall 66) that is interposed between the second nitride sidewall 68 and the insulator cap 65. That is to say, a self-aligned contact can be formed easily. Moreover, the lower side edges of the floating gate electrode 62 are covered with the pad oxide film 67. Accordingly, no stress is applied from the first or second nitride sidewall 66 or 68 to the tunnel insulating film 61, floating gate electrode 62 or silicon substrate 10. Thus, the quality of the tunnel insulating film 61 does not deteriorate and the characteristics of memory cell transistors can be uniformized.

It should be noted that at least the uppermost part of the insulator cap 65 is preferably made of silicon nitride. Accordingly, the insulator cap 65 may be a stack of two or three layers including silicon dioxide and nitride films.

The interelectrode insulating film 63 does not have to be a single layer silicon dioxide film. Alternatively, the film 63 may be an ONO film, in which a silicon nitride film is sandwiched between upper and lower silicon dioxide films, or an ON film, in which a silicon dioxide film is deposited on a silicon nitride film.

In the foregoing embodiment, the trench isolations 11 are formed before the silicon dioxide film 60 is deposited as a prototype of the tunnel insulating film 61. Alternatively, a field oxide film may be formed by a LOCOS process.

Also, the method of this embodiment is equally applicable to a process of forming trench isolations after a silicon dioxide film has been formed as a prototype of a tunnel insulating film (see Japanese Laid-Open Publication No. 7-324749, for example).

EMBODIMENT 3

Figure 6:
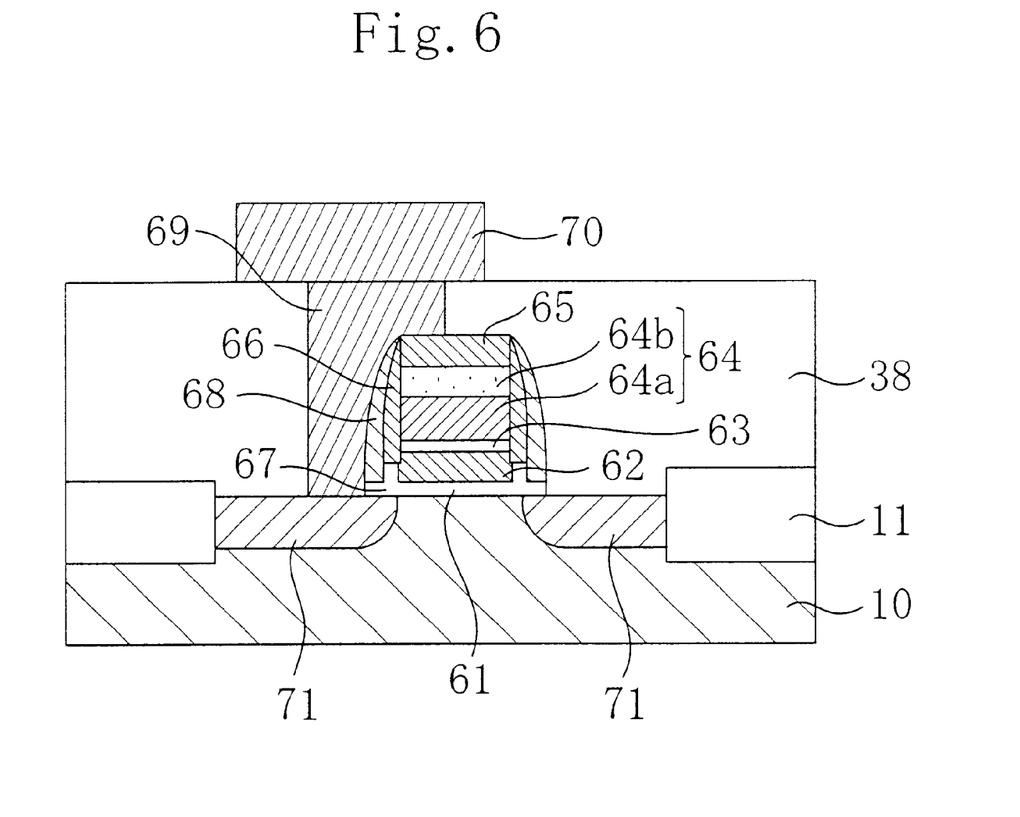
FIG. 6 is a cross-sectional view of a semiconductor device according to a third embodiment of the present invention.

FIG. 6 illustrates a cross section of a memory cell transistor for a nonvolatile memory, which is an exemplary semiconductor device according to a third embodiment of the present invention. As shown in FIG. 6, trench isolations 11 are formed on an Si substrate 10 and a transistor for a nonvolatile memory cell is formed in an active region surrounded by the trench isolations 11. The transistor includes: a tunnel insulating film 61 of silicon dioxide; a floating gate electrode 62 of polysilicon; an interelectrode insulating film 63 of silicon dioxide; a control gate electrode 64; and an insulator cap 65 of silicon nitride. These films 61, 62, 63, 64 and 65 are stacked in this order on the Si substrate 10. The transistor further includes a pad oxide film 67 of silicon dioxide and first and second nitride sidewalls 66 and 68 of silicon nitride. The control gate electrode 64 consists of a polysilicon portion 64a and a low-resistance portion 64b. As can be seen from FIG. 6, the transistor according to the third embodiment has almost the same structure as the counterpart of the second embodiment.

The structure of the semiconductor device according to the third embodiment is characterized in the following respects. Specifically, the first nitride sidewall 66 is formed to cover not only the side faces of the insulator cap 65 and the control gate electrode 64, but also the upper part of the side faces of the floating gate electrode 62. And the pad oxide film 67 covers the other part (lower part) of the side faces of the floating gate electrode 62 and part of the upper surface of the semiconductor substrate 10.

Such a structure can also attain the same effects as those attainable by the semiconductor device of the second embodiment. In addition, since the side faces of the interelectrode insulating film 63 are covered with the first nitride sidewall 66, no bird's beaks are formed at the edges of the interelectrode insulating film 63 even when the pad oxide film 67 is formed. Thus, high capacitance coupling is obtained between the control gate electrode 64 and the floating gate electrode 62.

Hereinafter, it will be described with reference to FIGS. 7(a) through 7(d) how to fabricate the semiconductor device according to the third embodiment.

Figure 7A:
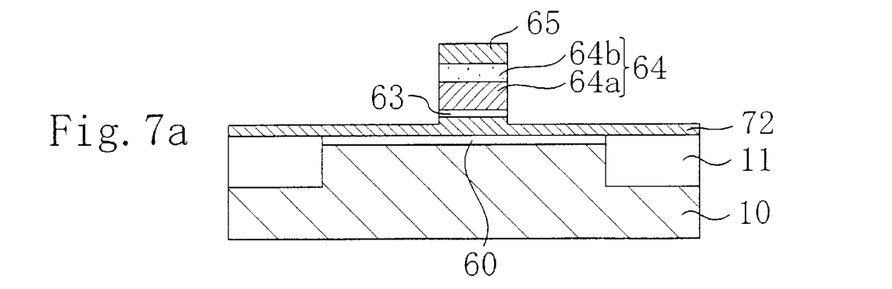
FIGS. 7(a) through 7(d) are cross-sectional views illustrating respective process steps for fabricating the semiconductor device according to the third embodiment.

First, before the structure shown in FIG. 7(a) is formed, the trench isolations 11 are formed on the Si substrate 10 to surround the active region as in the first embodiment. Next, the surface of the Si substrate 10 is thermally oxidized to form a silicon dioxide film 60 thereon to a thickness of about 10 nm. Then, a first polysilicon film 72 with a thickness of about 100 nm, a silicon dioxide film with a thickness of about 20 nm, a second polysilicon film with a thickness of about 100 nm, a low-resistance film consisting of titanium nitride and tungsten films with thicknesses of about 10 nm and about 90 nm, respectively, and a silicon nitride film with a thickness of about 150 nm are deposited by a CVD process in this order on the silicon dioxide film 60. Subsequently, a resist pattern is defined to form the gate electrode and the silicon nitride, low-resistance, second polysilicon and silicon dioxide films are dry-etched and patterned in this order. In this manner, the insulator cap 65, the low-resistance 64b and polysilicon portions 64a of the control gate electrode 64 and the interelectrode insulating film 63 are formed as shown in FIG. 7(a). Thereafter, the first polysilicon film 72 is partially etched and patterned. That is to say, etching is stopped in a midway point of the first polysilicon film 72.

As described in the first embodiment, the first polysilicon film 72 should preferably consist of a lower heavily doped portion and an upper non-doped portion that have been deposited separately such that the etch selectivity of the upper to the lower portion can be increased.

Figure 7B:
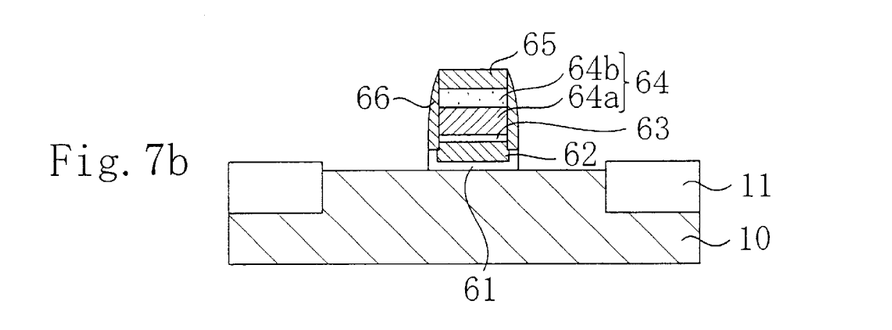
Figure 7C:
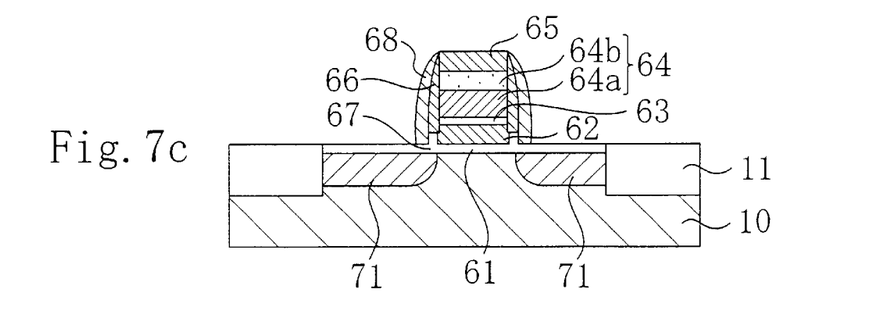
Figure 7D:
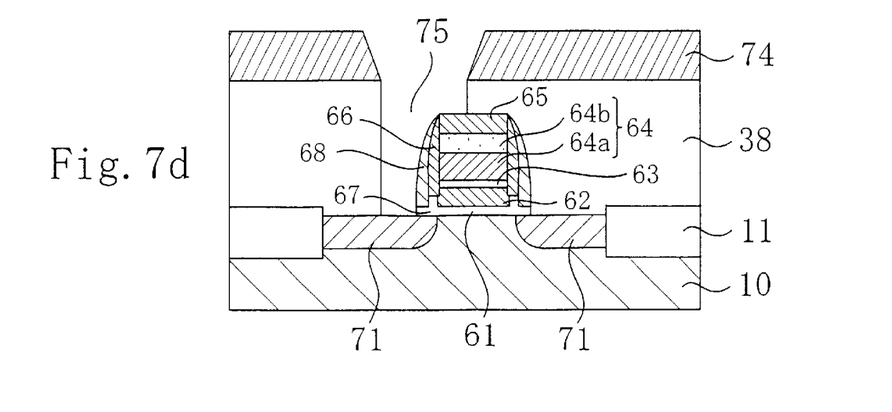

Then, respective process steps similar to those described in the second embodiment with reference to FIGS. 5(b) through 5(d) are performed as shown in FIGS. 7(b) through 7(d), thereby completing a memory cell transistor with the structure shown in FIG. 6.

In the fabrication process according to this embodiment, the same effects as those attainable by the second embodiment can also be attained. In addition, both edges of the interelectrode insulating film 63 are covered with the first nitride sidewall 66 in the process step shown in FIG. 7(c), no bird's beaks are formed at these edges of the interelectrode insulating film 63. That is to say, capacitance coupling is caused with much more certainty between the control gate 64 and floating gate electrodes 62.

It should be noted that at least the uppermost part of the insulator cap 65 is preferably made of silicon nitride. Accordingly, the insulator cap 65 may be a stack of two or three layers including silicon dioxide and nitride films.

The interelectrode insulating film 63 does not have to be a single layer silicon dioxide film. Alternatively, the film 63 may be an ONO film, in which a silicon nitride film is sandwiched between upper and lower silicon dioxide films, or an ON film, in which a silicon dioxide film is deposited on a silicon nitride film.

In the foregoing embodiment, the trench isolations 11 are formed before the silicon dioxide film 60 is deposited as a prototype of the tunnel insulating film 61. Alternatively, a field oxide film may be formed by a LOCOS process.

Also, the method of this embodiment is equally applicable to a process of forming trench isolations after a silicon dioxide film has been formed as a prototype of a tunnel insulating film (see Japanese Laid-Open Publication No. 7-324749, for example).

OTHER EMBODIMENTS

The semiconductor device according to the second embodiment shown in FIG. 4 may be modified such that the first nitride sidewall 66 covers all the side faces of the low-resistance portion 64b and part of the side faces of the polysilicon portion 64a in the control gate electrode 64. Even so, the same effects as those attainable by the second embodiment can also be attained.

What is claimed is:

1. A method for fabricating a semiconductor device, comprising the steps of:
    (a) forming an insulating film for a gate, a lower electrode film made of silicon, an upper electrode film and a cap insulating film in this order on a semiconductor substrate, at least an uppermost part of the upper electrode film being made of a material containing a metal, at least an uppermost part of the cap insulating film being made of silicon nitride;
    (b) etching at least the cap insulating film and the upper electrode film to form an insulator cap and an upper electrode of a gate electrode and stopping etching no later than completion of etching the lower electrode film;

(c) forming a first nitride sidewall on respective side faces of the insulator cap and the upper electrode of the gate electrode that have been patterned in the step (b) and on an etched part of the side faces of the lower electrode film;

(d) etching non-etched parts of the lower electrode film and the insulating film for the gate using the first nitride sidewall and the insulator cap as a mask, thereby forming a lower electrode for the gate electrode and a gate insulating film;

(e) forming a pad oxide film by thermal oxidation on part of the side faces of the lower electrode of the gate electrode that is located under the first nitride sidewall and on part of the upper surface of the semiconductor substrate;

(f) forming a second nitride sidewall on the first nitride sidewall and on the pad oxide film;

(g) defining doped regions within the semiconductor substrate such that the doped regions are located beside the gate electrode;

(h) forming an interval dielectric film over the semiconductor substrate; and (i) forming a contact hole that passes through the interlevel dielectric film to reach one of the doped regions and is self-aligned with the gate electrode, wherein in the step a) further comprises the step of forming the first silicon film for making the lower electrode film by laminating a first silicon film and a second silicon film which can be etched selectively with respect to the first silicon film, and wherein in the step b) further comprises the step of using the first silicon film as etch stopper.

2. The method of claim 1, wherein the first silicon film is a highly-doped polysilicon film, and wherein the second silicon film is a non-doped polysilicon film.

3. The method of claim 1, wherein in the step a), the upper and lower electrode films are stacked one upon the other such that the upper electrode film is in direct contact with the upper surface of the lower electrode film.

4. The method of claim 3, wherein the etching step b) is stopped after part of the lower electrode film has been etched and the other part thereof has not been etched yet, and wherein in the step c), the first nitride sidewall is formed on the etched part of the side faces of the lower electrode film, and wherein in the step e), the pad oxide film is formed on the other part of the side faces of the lower electrode and on the part of the upper surface of the semiconductor substrate.

5. A method for fabricating a semiconductor device, comprising the steps of:

(a) forming a gate insulating film, a lower electrode film made of silicon, an upper electrode film and a cap insulating film in this order on a semiconductor substrate, at least an uppermost part of the upper electrode film being made of a material containing a metal, at least an uppermost part of the cap insulating film being made of silicon nitride;

(b) etching at least the cap insulating film and the upper electrode film to form an insulator cap and an upper electrode of a gate electrode and stopping etching no later than completion of etching the lower electrode film;

(c) forming a first nitride sidewall on respective side faces of the insulator cap and the upper electrode of the gate electrode that have been patterned in the step (b) and on an etched part of the side faces of the lower electrode film;

(d) etching non-etched parts of the lower electrode film and the insulating film for the gate using the first nitride sidewall and the insulator cap as a mask, thereby forming a lower electrode for the gate electrode and a gate insulating film;

(e) forming a pad oxide film by thermal oxidation on part of the side faces of the lower electrode of the gate electrode that is located under the first nitride sidewall and on part of the upper surface of the semiconductor substrate;

(f) forming a second nitride sidewall on the first nitride sidewall and on the pad oxide film;

(g) defining doped regions within the semiconductor substrate such that the doped regions are located beside the gate electrode;

(h) forming an interlevel dielectric film over the semiconductor substrate; and (i) forming a contact hole that passes through the interlevel dielectric film to reach one of the doped regions and is self-aligned with the gate electrode, wherein the step (a), an interelectrode insulating film is formed between the upper and lower electrode films, and wherein the step (b), a control gate electrode is formed as the upper electrode, and wherein the step (d), a floating gate electrode is formed as the lower electrode.

6. The method of claim 5, wherein in the step a), a single layer metal film is formed as the upper electrode film.

7. The method of claim 5, wherein in the step a), a silicon film and a conductor film containing a metal are stacked in this order to form the upper electrode film.

8. The method of claim 5, wherein in the step b), the interelectrode insulating film is used as an etch stopper and etching is stopped when the lower electrode film is not etched at all, and wherein in the step c), the first nitride sidewall is formed on the side faces of the upper electrode and on at least part of the side faces of the interelectrode insulating film, and wherein in the step e), the pad oxide film is formed at least over the entire side faces of the lower electrode.

9. The method of claim 5, wherein the etching step b) is stopped after part of the lower electrode film has been etched but the other part thereof has not been etched yet, and wherein in the step c), the first nitride sidewall is formed on the side faces of the upper electrode and the interelectrode insulating film and on part of the side faces of the lower electrode film, and wherein in the step e), the pad oxide film is formed on the other part of the side faces of the lower electrode, except for the part covered with the first nitride sidewall, and on the part of the upper surface of the semiconductor substrate.

* * * * *